(12) United States Patent
Kim et al.

(10) Patent No.: US 11,515,254 B2
(45) Date of Patent: Nov. 29, 2022

(54) SEMICONDUCTOR CHIP INCLUDING PENETRATING ELECTRODES, AND SEMICONDUCTOR PACKAGE INCLUDING THE SEMICONDUCTOR CHIP

(71) Applicant: SK hynix Inc., Icheon-si Gyeonggi-do (KR)

(72) Inventors: Ki Bum Kim, Icheon-si Gyeonggi-do (KR); Bok Kyu Choi, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 88 days.

(21) Appl. No.: 17/088,363

(22) Filed: Nov. 3, 2020

(65) Prior Publication Data

US 2022/0020690 A1    Jan. 20, 2022

(30) Foreign Application Priority Data

Jul. 15, 2020   (KR) .................. 10-2020-0087380

(51) Int. Cl.
*H01L 23/528*   (2006.01)
*H01L 23/31*    (2006.01)
(Continued)

(52) U.S. Cl.
CPC ...... *H01L 23/5286* (2013.01); *H01L 23/3121* (2013.01); *H01L 23/5329* (2013.01); *H01L 25/0657* (2013.01)

(58) Field of Classification Search
CPC . H01L 2224/05025; H01L 2224/05568; H01L 2224/05571; H01L 2224/05573;
(Continued)

(56) References Cited

U.S. PATENT DOCUMENTS

| 8,304,863 | B2 * | 11/2012 | Filippi ............... H01L 25/0657 438/106 |
| 8,344,496 | B1 * | 1/2013 | White ................. H01L 23/5286 257/691 |
| 8,552,548 | B1 * | 10/2013 | Do .......................... H01L 24/11 257/E21.597 |

(Continued)

FOREIGN PATENT DOCUMENTS

| KR | 101711710 B1 | 3/2017 |
| KR | 101892876 B1 | 8/2018 |

*Primary Examiner* — Jaehwan Oh
*Assistant Examiner* — John M Parker
(74) *Attorney, Agent, or Firm* — William Park & Associates Ltd.

(57) ABSTRACT

A semiconductor chip may include: a body portion including a front surface and a back surface; penetrating electrodes penetrating the body portion; and back connection electrodes disposed over the back surface of the body portion and connected to the penetrating electrodes, wherein the penetrating electrodes include a power penetrating electrode for transmitting a power voltage and a ground penetrating electrode for transmitting a ground voltage, the back connection electrodes include a power back connection electrode connected to the power penetrating electrode and a ground back connection electrode connected to the ground penetrating electrode, and one power back connection electrode is connected with two or more power penetrating electrodes, and one ground back connection electrode is connected with two or more ground penetrating electrodes.

17 Claims, 8 Drawing Sheets

(51) Int. Cl.
*H01L 25/065* (2006.01)
*H01L 23/532* (2006.01)

(58) Field of Classification Search
CPC . H01L 2224/05599; H01L 2224/13025; H01L 2224/16225; H01L 2224/16145; H01L 2224/17181; H01L 2224/32225; H01L 2224/73265; H01L 2224/73207; H01L 2224/73204; H01L 2224/48227; H01L 2224/45099; H01L 2224/48091; H01L 2224/45015; H01L 24/48; H01L 24/73; H01L 23/481; H01L 23/045
See application file for complete search history.

(56) References Cited

U.S. PATENT DOCUMENTS

| | | | |
|---|---|---|---|
| 9,515,006 B2 * | 12/2016 | Reber | H01L 23/3114 |
| 11,145,657 B1 * | 10/2021 | Or-Bach | G11C 5/025 |
| 2009/0057867 A1 * | 3/2009 | Hool | H01L 23/045 |
| | | | 257/E23.141 |
| 2012/0139092 A1 * | 6/2012 | Su | H01L 25/0657 |
| | | | 257/E23.114 |
| 2013/0256864 A1 * | 10/2013 | Nagano | H01L 21/78 |
| | | | 257/690 |
| 2013/0258792 A1 * | 10/2013 | Kitano | G11C 5/06 |
| | | | 257/296 |
| 2014/0199834 A1 * | 7/2014 | Gu | H01L 23/5286 |
| | | | 438/667 |
| 2016/0141274 A1 * | 5/2016 | Or-Bach | H01L 23/36 |
| | | | 257/659 |
| 2021/0143162 A1 * | 5/2021 | Yun | G11C 16/24 |
| 2021/0202907 A1 * | 7/2021 | Lee | H01L 27/3276 |

* cited by examiner

SEMICONDUCTOR CHIP INCLUDING PENETRATING ELECTRODES, AND SEMICONDUCTOR PACKAGE INCLUDING THE SEMICONDUCTOR CHIP

CROSS-REFERENCE TO RELATED APPLICATION

This application claims priority under 35 U.S.C. § 119 to Korean Patent Application No. 10-2020-0087380 filed on Jul. 15, 2020, which is incorporated herein by reference in its entirety.

BACKGROUND

1. Technical Field

This patent document relates to a semiconductor technology, and more particularly, to a semiconductor chip including penetrating electrodes, and a semiconductor package including the semiconductor chip.

2. Related Art

Electronic products require high-volume data processing while the sizes of these electronic products are reduced. Accordingly, a semiconductor chip used in such electronic products are also required to have a thin thickness and a small size. Further, a semiconductor package in which a plurality of semiconductor chips are embedded therein has been manufactured.

The plurality of semiconductor chips may be connected to each other by penetrating vias passing through each semiconductor chip and providing an electrical connection path.

SUMMARY

In an embodiment, a semiconductor chip may include: a body portion including a front surface and a back surface; penetrating electrodes penetrating the body portion; and back connection electrodes disposed over the back surface of the body portion and connected to the penetrating electrodes, wherein the penetrating electrodes include a power penetrating electrode for transmitting a power voltage and a ground penetrating electrode for transmitting a ground voltage, the back connection electrodes include a power back connection electrode connected to the power penetrating electrode and a ground back connection electrode connected to the ground penetrating electrode, and one power back connection electrode is connected with two or more power penetrating electrodes, and one ground back connection electrode is connected with two or more ground penetrating electrodes.

In another embodiment, a semiconductor package may include: a first semiconductor chip; and a second semiconductor chip stacked in a vertical direction with the first semiconductor chip, wherein each of the first and second semiconductor chips includes: a body portion including a front surface and a back surface; penetrating electrodes penetrating the body portion; and back connection electrodes disposed over the back surface of the body portion and connected to the penetrating electrodes, wherein the penetrating electrodes include a power penetrating electrode for transmitting a power voltage and a ground penetrating electrode for transmitting a ground voltage, the back connection electrodes include a power back connection electrode connected to the power penetrating electrode and a ground back connection electrode connected to the ground penetrating electrode, and one power back connection electrode is connected with two or more power penetrating electrodes, and one ground back connection electrode is connected with two or more ground penetrating electrodes.

DETAILED DESCRIPTION

Figure 1:
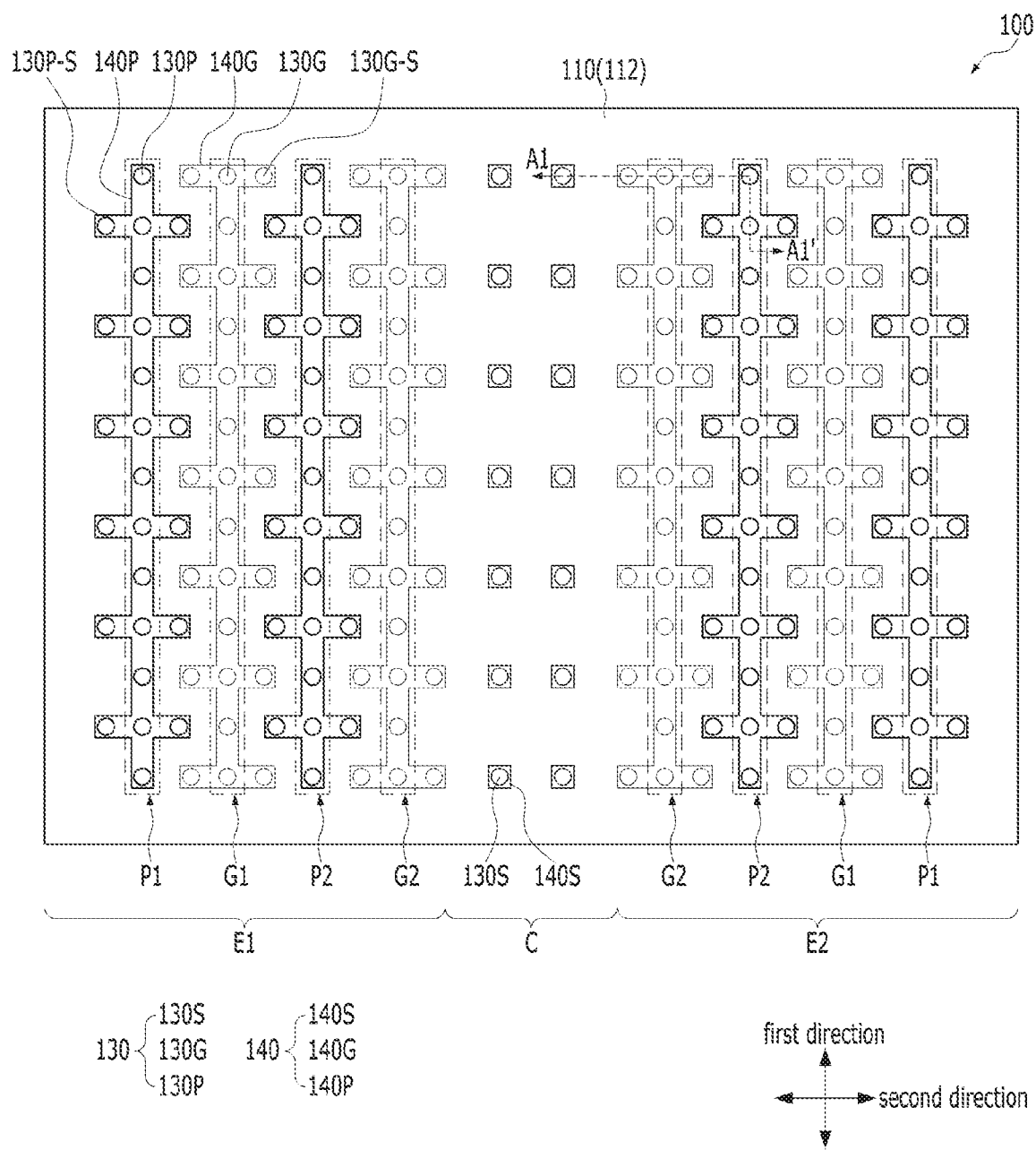
FIGS. 1 and 2 are views illustrating a semiconductor chip according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 2:
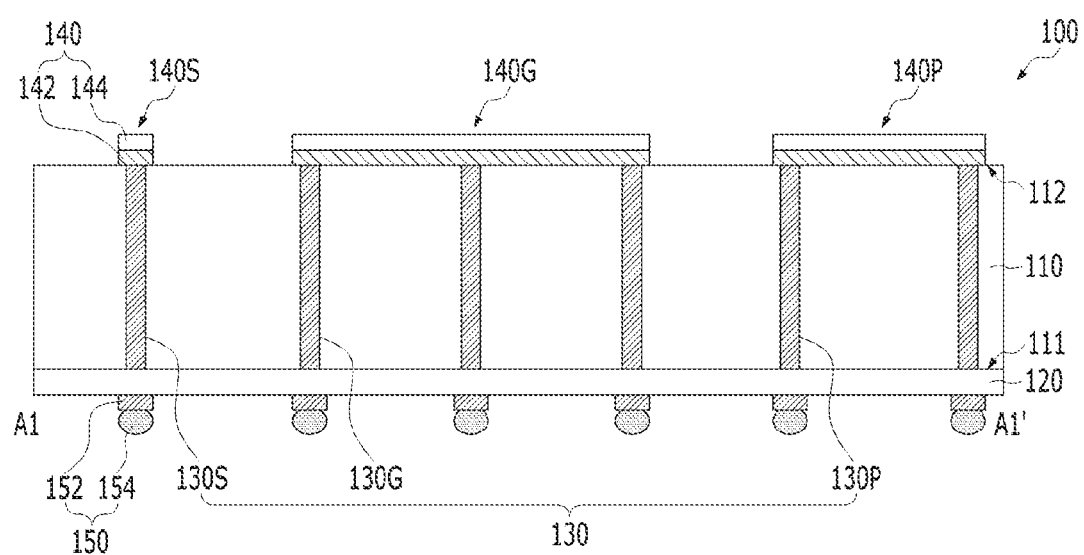

FIGS. 1 and 2 are views illustrating a semiconductor chip according to an embodiment of the present disclosure. For example, FIG. 1 is a planar view showing a back surface of the semiconductor chip of the present embodiment, and FIG. 2 is a cross-sectional view taken along a line A1-A1' of FIG. 1.

Referring to FIGS. 1 and 2, a semiconductor chip 100 of the present embodiment may include a body portion 110, a wiring portion 120, penetrating electrodes 130, back connection electrodes 140, and front connection electrodes 150.

The body portion 110 may be formed of a semiconductor material such as silicon or germanium, and may have a plate shape defined by a front surface 111, a back surface 112, and side surfaces connecting them to each other. As an example, the body portion 110 may have a plate shape having a rectangular planar shape. The front surface 111 of the body portion 110 may mean an active surface on which an integrated circuit (not shown) having various functions is formed. In this case, the integrated circuit may be variously implemented according to the type of the semiconductor chip 100. For example, when the semiconductor chip 100 includes volatile memory such as DRAM (Dynamic Random Access Memory) and SRAM (Static RAM), or nonvolatile memory such as NAND flash, RRAM (Resistive RAM), PRAM (Phase-change RAM), MRAM (Magneto-resistive RAM), and FRAM (Ferroelectric RAM), the integrated circuit may include a memory array including a plurality of memory cells. The back surface 112 of the body portion 110 may mean a surface located opposite to the front surface 111.

The wiring portion 120 may be formed on the front surface 111 of the body portion 110. Although not shown, the wiring portion 120 may include a wiring structure electrically connected to the integrated circuit formed on the front surface 111 of the body portion 110, and an insulating layer filling a remaining region where the wiring structure is not formed.

The penetrating electrodes 130 may be formed in the body portion 110. The penetrating electrode 130 may have a pillar shape extending from the front surface 111 to the back surface 112 of the body portion 110 and penetrating the body portion 110. As an example, the penetrating electrode 130 may be a TSV (Through Silicon Via). The penetrating electrode 130 may include various conductive materials. As an example, the penetrating electrode 130 may include a metal such as copper (Cu), tin (Sn), silver (Ag), tungsten (W), nickel (Ni), ruthenium (Ru), and cobalt (Co), or a compound of this metal. Although not shown, an insulating liner for insulating the penetrating electrode 130 and the body portion 110 may be interposed between the penetrating electrode 130 and the body portion 110. Further, although not shown, a barrier metal layer for preventing diffusion of the metal forming the penetrating electrode 130 may be formed to surround a sidewall of the penetrating electrode 130. One end of the penetrating electrode 130 may be connected to the wiring portion 120, and the other end of the penetrating electrode 130 may be connected to the back connection electrode 140.

In the present embodiment, the penetrating electrodes 130 may be arranged along a first direction and a second direction, in a planar view. In this case, the penetrating electrodes 130 may include a signal penetrating electrode 130S for transmission of a signal, a ground penetrating electrode 130G for transmission of a ground voltage, and a power penetrating electrode 130P for transmission of a power voltage. The signal penetrating electrode 130S may be disposed in a central region C in the second direction, and the ground penetrating electrode 130G and the power penetrating electrode 130P may be disposed in both edge regions E1 and E2 in the second direction. The reason for this arrangement may be to effectively reduce warpage of the semiconductor chip 100, and will be described more in a corresponding part.

Here, the both edge regions E1 and E2 in the second direction may mean a region in which a distance from both sides of the semiconductor chip 100 in the second direction is smaller than a width of the semiconductor chip 100 in the second direction. In addition, the central region C may be a region between the both edge regions E1 and E2 in the second direction. For convenience of description, one of the both edge regions E1 and E2 in the second direction, for example, a region located at a left side in a planar view, will be referred to as a first edge region E1, and the other of the both edge regions E1 and E2 in the second direction, for example, a region located at a right side in a planar view, will be referred to as a second edge region E2.

A plurality of signal penetrating electrodes 130S arranged in a matrix along the first and second directions may be disposed in the central region C.

A plurality of power penetrating electrodes 130P arranged in a line along the first direction may be disposed in the first edge region E1. The plurality of power penetrating electrodes 130P arranged in a line along the first direction will be referred to as a column of power penetrating electrodes 130P. One or more columns of power penetrating electrodes 130P may be disposed in the first edge region E1. The columns of power penetrating electrodes 130P may be disposed to be spaced apart from each other in the second direction. In the present embodiment, in the first edge region E1, a first column P1 of power penetrating electrodes 130P and a second column P2 of power penetrating electrodes 130P may be disposed to be spaced apart from each other in the second direction.

In addition, a plurality of ground penetrating electrodes 130G arranged in a line along the first direction may be disposed in the first edge region E1. The plurality of ground penetrating electrodes 130G arranged in a line along the first direction will be referred to as a column of ground penetrating electrodes 130G. One or more columns of ground penetrating electrodes 130G may be disposed in the first edge region E1. The columns of ground penetrating electrodes 130G may be disposed to be spaced apart from each other in the second direction. In the present embodiment, in the first edge region E1, a first column G1 of ground penetrating electrodes 130G and a second column G2 of ground penetrating electrodes 130G may be disposed to be spaced apart from each other in the second direction.

In particular, in the present embodiment, the columns of power penetrating electrodes 130P and the columns of ground penetrating electrodes 130G may be alternately disposed along the second direction. As an example, the first column P1 of power penetrating electrodes 130P, the first column G1 of ground penetrating electrodes 130G, the second column P2 of power penetrating electrodes 130P, and the second column G2 or ground penetrating electrodes 130G may be sequentially disposed in a direction from left to right in the second direction. This may be to increase a capacitance between a power back connection electrode 140P and a ground back connection electrode 140G, which will be described later, by increasing the opposing area therebetween. This will be described more in a corresponding part.

Further, the power penetrating electrode 130P may be further disposed at each of both sides of some of the power penetrating electrodes 130P included in the column of power penetrating electrodes 130P in the second direction. This power penetrating electrode 130P, that is not included in the column of power penetrating electrodes 130P and is disposed at one side or both sides thereof, will be referred to as a side power penetrating electrode 130P-S. As an example, in the column of power penetrating electrodes 130P, the power penetrating electrode 130P which is disposed next to the side power penetrating electrode 130P-S, and the power penetrating electrode 130P which is not disposed next to the side power penetrating electrode 130P-S may be alternately arranged in the first direction. For example, as shown in FIG.

1, in the column of power penetrating electrodes 130P, the side power penetrating electrodes 130P-S may be disposed at both sides of even-numbered power penetrating electrodes 130P in a first direction.

In addition, the ground penetrating electrode 130G may be further disposed at each of both sides of some of the ground penetrating electrodes 130G included in the column of ground penetrating electrodes 130G in the second direction. This ground penetrating electrode 130G, that is not included in the column of ground penetrating electrodes 130G and is disposed at one side or both sides thereof, will be referred to as a side ground penetrating electrode 130G-S. As an example, in the column of ground penetrating electrodes 130G, the ground penetrating electrode 130G which is disposed next to the side ground penetrating electrode 130G-S, and the ground penetrating electrode 130G which is not disposed next to the side ground penetrating electrode 130G-S may be alternately arranged in the first direction. Here, when two side power penetrating electrodes 130P-S are disposed at the both sides of the even-numbered power penetrating electrodes 130P in the first direction in the column of power penetrating electrodes 130P, the side ground penetrating electrodes 130G-S may be disposed at both sides of the odd-numbered grounding penetrating electrodes 130G in the first direction in the column of ground penetrating electrodes 130G. This may be to make an area in which the side power penetrating electrode 130P-S is formed and an area in which the side ground penetrating electrode 130G-S is formed alternately with each other. As another example, if the side power penetrating electrodes 130P-S are disposed at the both sides of the odd-numbered power penetrating electrodes 130P in the first direction in the column of power penetrating electrodes 130P, the side ground penetrating electrodes 130G-S may be disposed at the both sides of the even-numbered ground penetrating electrodes 130G in the first direction in the column of ground penetrating electrodes 130G. In this case, the capacitance between the power back connection electrode 140P and the ground back connection electrode 140G, to be described later, may be further increased, by increasing the opposing area therebetween and reducing a distance therebetween. The side power penetrating electrode 130P-S and the side ground penetrating electrode 130G-S may be alternately arranged along the first direction between the column of power penetrating electrodes 130P and the column of ground penetrating electrodes 130G.

In the first edge region E1, the arrangement of the column of power penetrating electrodes 130P and the side power penetrating electrodes 130P-S adjacent thereto may be repeated along the second direction. For example, the arrangement of the first column P1 of power penetrating electrodes 130P and the side power penetrating electrodes 130P-S adjacent thereto may be the same as the arrangement of the second column P2 of power penetrating electrodes 130P and the side power penetrating electrodes 130P-S adjacent thereto. In addition, in the first edge region E1, the arrangement of the column of ground penetrating electrodes 130G and the side ground penetrating electrodes 130G-S adjacent thereto may be repeated along the second direction. For example, the arrangement of the first column G1 of ground penetrating electrodes 130G and the side ground penetrating electrodes 130G-S adjacent thereto may be the same as the arrangement of the second column G2 of ground penetrating electrodes 130G and the side ground penetrating electrodes 130G-S adjacent thereto.

The plurality of power penetrating electrodes 130P and the plurality of ground penetrating electrodes 130G may also be disposed in the second edge region E. Here, the power penetrating electrodes 130P and the ground penetrating electrodes 130G in the second edge region E2 may be arranged to be symmetrical with the power penetrating electrodes 130P and the ground penetrating electrodes 130G in the first edge region E1, with the center region C interposed therebetween. Accordingly, as an example, in the second edge region E2, the first column P1 of power penetrating electrodes 130P and the side power penetrating electrodes 130P-S adjacent thereto, the first column G1 of ground penetrating electrodes 130G and the side ground penetrating electrodes 130G-S adjacent thereto, the second column P2 of power penetrating electrodes 130P and the side power penetrating electrodes 130P-S adjacent thereto, and the second column G2 of ground penetrating electrodes 130G and the side ground penetrating electrodes 130G-S adjacent thereto, may be sequentially disposed in a direction from right to left in the second direction.

The back connection electrodes 140 may be formed over the back surface 111 of the body portion 110. The back connection electrode 140 may be for connecting the penetrating electrode 130 to another component (not shown) to be positioned over the semiconductor chip 100, for example, another semiconductor chip. As an example, the back connection electrode 140 may be a conductive bump. In this case, the back connection electrode 140 may include a stacked structure of a metal body 142 which is connected to the penetrating electrode 130, and a wetting layer 144 which is formed over the metal body 142 and is to be connected to another component (not shown), for example, a solder layer of another semiconductor chip. The metal body 142 may include various metals, such as copper, and the wetting layer 144 may include a metal through which a solder material can be wet, such as nickel. However, the present embodiment is not limited thereto, and a layered-structure, a material, or the like of the back connection electrode 140 may be variously modified.

The back connection electrodes 140 may include a signal back connection electrode 140S connected to the signal penetrating electrode 130S, a power back connection electrode 140P connected to the power penetrating electrode 130P, a ground back connection electrode 140G connected to the ground penetrating electrode 130G.

The signal back connection electrode 140S may be formed to overlap and connect with each of the signal penetrating electrodes 130S. That is, the signal back connection electrodes 140S and the signal penetrating electrodes 130S may correspond one-to-one. Accordingly, the signal back connection electrodes 140S may be arranged in a matrix along the first direction and the second direction in the central region C. On the other hand, the power back connection electrode 140P may be formed to be connected to two or more power penetrating electrodes 130P at the same time, and the ground back connection electrode 140G may be formed to be connected to two or more ground penetrating electrodes 130G at the same time. In this case, there are the following advantages.

The wiring portion 120 including various metals may exist on the front surface 111 of the semiconductor chip 100, whereas the wiring portion 120 might not exist on the back surface 112 of the semiconductor chip 100. Therefore, a phenomenon in which the semiconductor chip 100 is bent may occur due to a difference in the coefficient of thermal expansion between the back surface 112 and the front surface 111. This phenomenon may be intensified as the area occupied by the wiring portion 120 in the semiconductor chip 100 increases, and as the thickness of the semiconductor chip 100 decreases. When a semiconductor package is to be implemented by stacking a plurality of semiconductor chips, such warpage may cause various problems such as poor connection between the semiconductor chips. In the present embodiment, because the power back connection electrode 140P overlaps with two or more power penetrating electrodes 130P, and the ground back connection electrode 140G overlaps with two or more ground penetrating electrodes 130G, the degree of metal material formation on the back surface 112 may increase. Accordingly, the warpage of the semiconductor chip 100 may be reduced and/or prevented. In particular, by arranging these power back connection electrode 140P and ground back connection electrode 140G in the first and second edge regions E1 and E2, the warpage of the semiconductor chip 100 may be more effectively reduced and/or prevented. This is because the warpage intensifies from the center to the edge. Further, because the power back connection electrode 140P is connected to two or more power penetrating electrodes 130P to form a power distribution network (PDN), and similarly, the ground back connection electrode 140G is connected to two or more ground penetrating electrodes 130G to form a PDN, supplying power may be stably performed. Furthermore, when the power back connection electrode 140P and the ground back connection electrode 140G which have side surfaces facing each other and spaced apart from each other form a capacitor, supplying power may be performed more stably as the capacitance of the capacitor is increased. Hereinafter, the arrangement of the power back connection electrode 140P and the ground back connection electrode 140G, which is more suitable for this capacitance increase, will be described.

Referring back to FIGS. 1 and 2, the power back connection electrode 140P may overlap and connect with the column of power penetrating electrodes 130P and the side power penetrating electrodes 130P-S adjacent thereto. In the present embodiment, in each of the first and second edge regions E1 and E2, two power back connection electrodes 140P may be connected to the first column P1 of power penetrating electrodes 130P and the side power penetrating electrodes 130P-S adjacent thereto, and the second column P2 of power penetrating electrodes 130P and the side power penetrating electrodes 130P-S adjacent thereto, respectively. Accordingly, the power back connection electrode 140P may have a shape in which a line portion extending in the first direction and protrusion portions protruding from the line portion to both sides in the second direction are combined. A plurality of protrusion portions of the power back connection electrode 140P may be arranged in the first direction. Accordingly, the power back connection electrode 140P may have a shape in which a cross shape is repeated along the first direction, as a whole.

In addition, the ground back connection electrode 140G may overlap and connect with the column of ground penetrating electrodes 130G and the side ground penetrating electrodes 130G-S adjacent thereto. In the present embodiment, in each of the first and second edge regions E1 and E2, two ground back connection electrodes 140G may be connected to the first column G1 of ground penetrating electrodes 130G and the side ground penetrating electrodes 130G-S adjacent thereto, and the second column G2 of ground penetrating electrodes 130G and the side ground penetrating electrodes 130G-S adjacent thereto, respectively. Accordingly, the ground back connection electrode 140G may have a shape in which a line portion extending in the first direction and protrusion portions protruding from the line portion to both sides in the second direction are combined. A plurality of protrusion portions of the ground back connection electrode 140G may be arranged in the first direction. Accordingly, the ground back connection electrode 140G may have a shape in which a cross shape is repeated along the first direction, as a whole.

In this case, the power back connection electrodes 140P and the ground back connection electrodes 140G may be alternately arranged along the second direction. In this case, the opposing area between the power back connection electrode 140P and the ground back connection electrode 140G may increase, and thus, the capacitance between them may increase.

Further, the protrusion portions of the power back connection electrode 140P and the protrusion portions of the ground back connection electrode 140G may be alternately arranged along the first direction. That is, the protrusion portion of the ground back connection electrode 140G may be disposed between the protrusion portions of the power back connection electrode 140P, which are adjacent to each other in the first direction, and the protrusion portion of the power back connection 140P may be disposed between the protrusion portions of the ground back connection electrode 140G, which are adjacent to each other in the first direction. In this case, because the opposing area between the power back connection electrode 140P and the ground back connection electrode 140G is further increased, and the distance between the power back connection electrode 140P and the ground back connection electrode 140G is reduced, the capacitance between them may be further increased.

The front connection electrodes 150 may be formed over the front surface 111 of the semiconductor chip 100, and further, may be formed over the wiring portion 120. The front connection electrode 150 may be for electrical connection with another component, such as another semiconductor chip or a substrate, positioned under the semiconductor chip 100.

The front connection electrode 150 may be electrically connected to the wiring portion 120. Furthermore, the front connection electrode 150 may be electrically connected to the penetrating electrode 130 through the wiring portion 120.

The front connection electrode 150 may include a metal body 152 and a solder layer 154 formed over the metal body 152. The metal body 152 may include various metals, such as copper. The solder layer 154 may be combined with a wetting layer in a manner that is wetted in the wetting layer. As an example, when a plurality of semiconductor chips 100 are stacked in a direction perpendicular to the front surface 111 or the back surface 112 of the body portion 110, the solder layer 154 of one of the semiconductor chips 100 may be bonded to the wetting layer 144 of another one of the semiconductor chips 100, which is positioned under the one of the semiconductor chips 100. This will be described later with reference to FIG. 3. The metal body 152 may have a pillar shape, and the solder layer 154 may have a ball shape. However, the present embodiment is not limited thereto, and a layered-structure, a material, or the like of the front connection electrode 150 may be variously modified.

According to the semiconductor chip 100 described above, the warpage phenomenon of the semiconductor chip 100 may be reduced and/or prevented, and the operating characteristics of the semiconductor chip 100 may be improved by supplying power stably.

Meanwhile, even if the semiconductor chip 100 of the above embodiment has a thin thickness, warpage of the semiconductor chip 100 may be prevented. Therefore, it may be easy to implement a semiconductor package in which a plurality of semiconductor chips 100 are stacked. This will be described, for example, with reference to FIG. 3.

Figure 3:
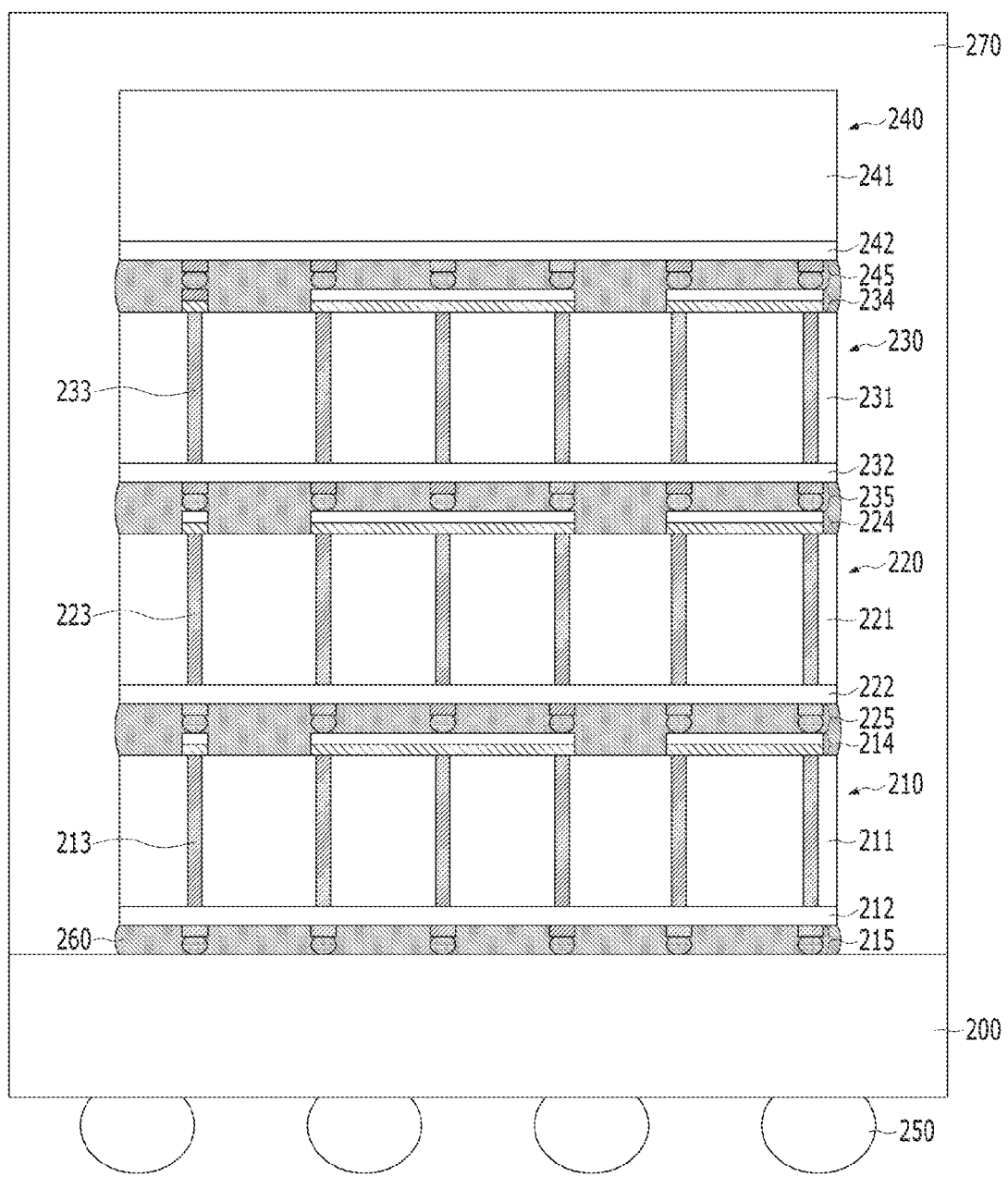
FIG. 3 is a cross-sectional view illustrating a semiconductor package according to an embodiment of the present disclosure.

FIG. 3 is a cross-sectional view illustrating a semiconductor package according to an embodiment of the present disclosure.

Referring to FIG. 3, the semiconductor package according to the present embodiment may include a substrate 200, and a plurality of semiconductor chips 210, 220, 230, and 240 stacked over the substrate 200 in a vertical direction. In the present embodiment, four semiconductor chips are stacked, but the present disclosure is not limited thereto, and the number semiconductor chips 210, 220, 230, and 240 stacked in the vertical direction may be variously modified. For convenience of description, the four semiconductor chips 210, 220, 230, and 240 will be referred to as a first semiconductor chip 210, a second semiconductor chip 220, and a third semiconductor chip 230, and a fourth semiconductor chip 240, according to a distance from the substrate 200.

The substrate 200 may be a substrate for a semiconductor package having a circuit and/or wiring structure for electric signal transmission, such as a printed circuit board (PCB). The substrate 200 may have an upper surface on which the plurality of semiconductor chips 210, 220, 230, and 240 are disposed, and a lower surface on which an external connection terminal 250 for connecting the semiconductor package to the outside is disposed while being located opposite to the upper surface. When the plurality of semiconductor chips 210, 220, 230, and 240 are memory chips, the substrate 200 may be a base substrate including a logic circuit that supports operations of these memory chips, for example, reading data from the memory chips or writing data to the memory chips.

Each of the first to third semiconductor chips 210, 220, and 230, except for the fourth semiconductor chip 240 positioned at the uppermost portion of the first to fourth semiconductor chips 210, 220, 230, and 240, may be substantially the same as the semiconductor chip of the above embodiment (see 100 in FIGS. 1 and 2). That is, the first semiconductor chip 210 may include a body portion 211 having a front surface and a back surface, a wiring portion 212 disposed over the front surface of the body portion 211, penetrating electrodes 213 penetrating the body portion 211, back connection electrodes 214 disposed over the back surface of the body portion 211 and connected to the penetrating electrodes 213, and front connection electrodes 215 over the wiring portion 212. The second semiconductor chip 220 may include a body portion 221 having a front surface and a back surface, a wiring portion 222 disposed over the front surface of the body portion 221, penetrating electrodes 223 penetrating the body portion 221, back connection electrodes 224 disposed over the back surface of the body portion 221 and connected to the penetrating electrodes 223, and front connection electrodes 225 over the wiring portion 222. The third semiconductor chip 230 may include a body portion 231 having a front surface and a back surface, a wiring portion 232 disposed over the front surface of the body portion 231, penetrating electrodes 233 penetrating the body portion 231, back connection electrodes 234 disposed over the back surface of the body portion 231 and connected to the penetrating electrodes 233, and front connection electrodes 235 over the wiring portion 232. Because the fourth semiconductor chip 240 is positioned at the uppermost portion, it might not include a penetrating electrode and a back connection electrode. That is, as shown, the fourth semiconductor chip 240 may include a body portion 241 having a front surface and a back surface, a wiring portion 242 disposed over the front surface of the body portion 241, and front connection electrodes 245 disposed over the wiring portion 242.

The first to fourth semiconductor chips 210, 220, 230, and 240 may be disposed such that the front surfaces of the body portions 211, 221, 231, and 241 face the upper surface of the substrate 200. Accordingly, the front connection electrode 215 of the first semiconductor chip 210 may be connected to the substrate 200. The back connection electrode 214 of the first semiconductor chip 210 may be connected to the front connection electrode 225 of the second semiconductor chip 220. The back connection electrode 224 of the second semiconductor chip 220 may be connected to the front connection electrode 235 of the third semiconductor chip 230. The back connection electrode 234 of the third semiconductor chip 230 may be connected to the front connection electrode 245 of the fourth semiconductor chip 240. Accordingly, electrical connection from the substrate 200 to the first to fourth semiconductor chips 210, 220, 230, and 240 may be made, and accordingly, a signal may be transmitted, or power may be supplied. In this case, because warpage of the first to fourth semiconductor chips 210, 220, 230, and 240 is reduced, such electrical connection may be facilitated.

Spaces between the first semiconductor chip 210 and the substrate 200, between the first semiconductor chip 210 and the second semiconductor chip 220, between the second semiconductor chip 220 and the third semiconductor chip 230, and between the third semiconductor chip 230 and the fourth semiconductor chip 240 may be filled with a filling material 260. The filling material 260 may be formed by flowing an underfill material into the spaces through a capillary phenomenon, and then curing the underfill material.

Further, the substrate 200 and the first to fourth semiconductor chips 210, 220, 230, and 240 may be surrounded by a molding layer 270. That is, the molding layer 270 may be formed to cover the first to fourth semiconductor chips 210, 220, 230, and 240 on the upper surface of the substrate 200. The molding layer 270 may include various molding materials such as EMC (Epoxy Mold Compound).

According to the semiconductor package of the present embodiment, the warpage of the semiconductor chips may be reduced and/or prevented, and thus, a connection failure between semiconductor chips caused by the warpage may be prevented. As a result, it may be possible to implement a semiconductor package including a plurality of semiconductor chips.

Figure 4:
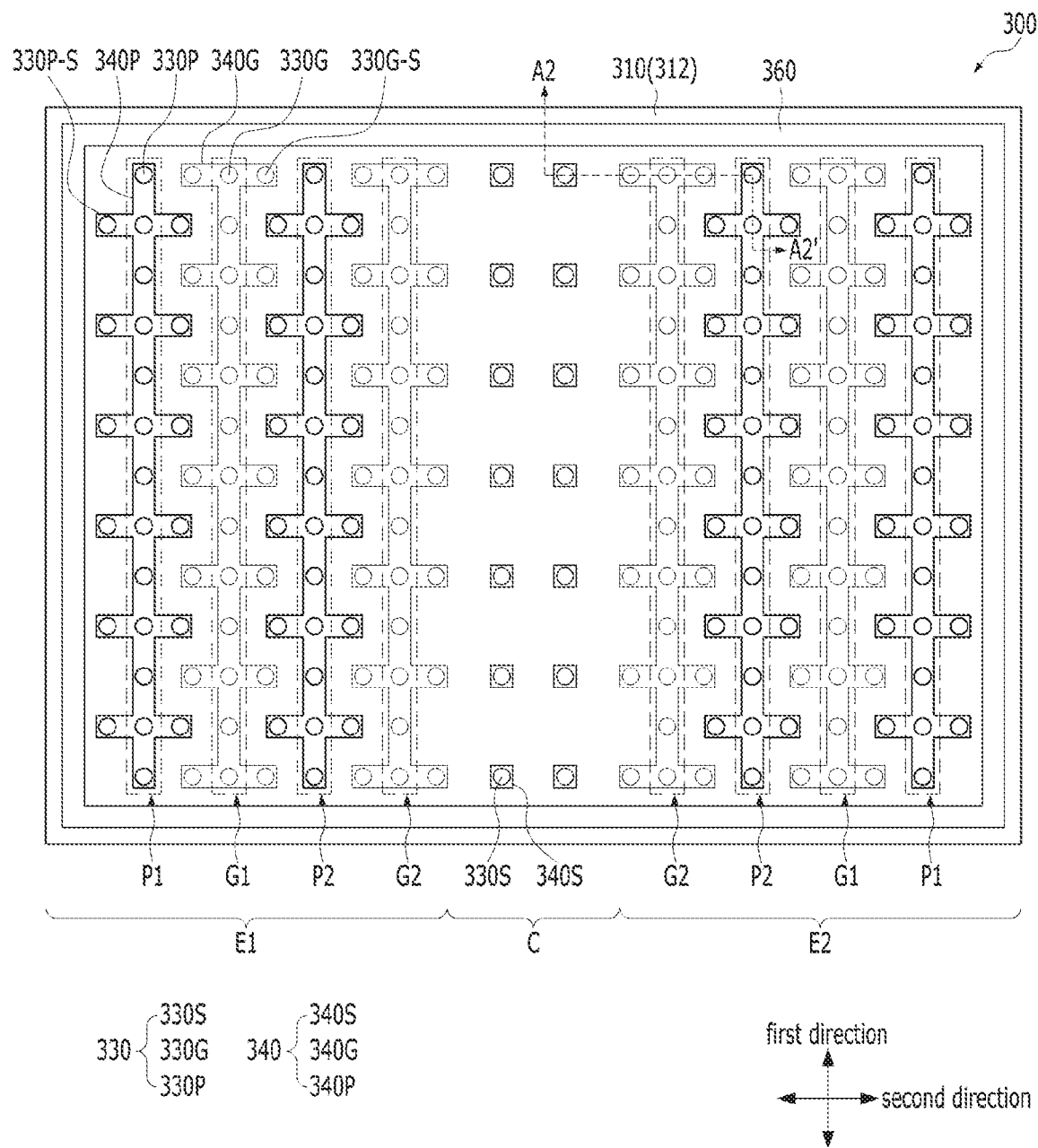
FIGS. 4 and 5 are views illustrating a semiconductor chip according to another embodiment of the present disclosure.
Figure 5:
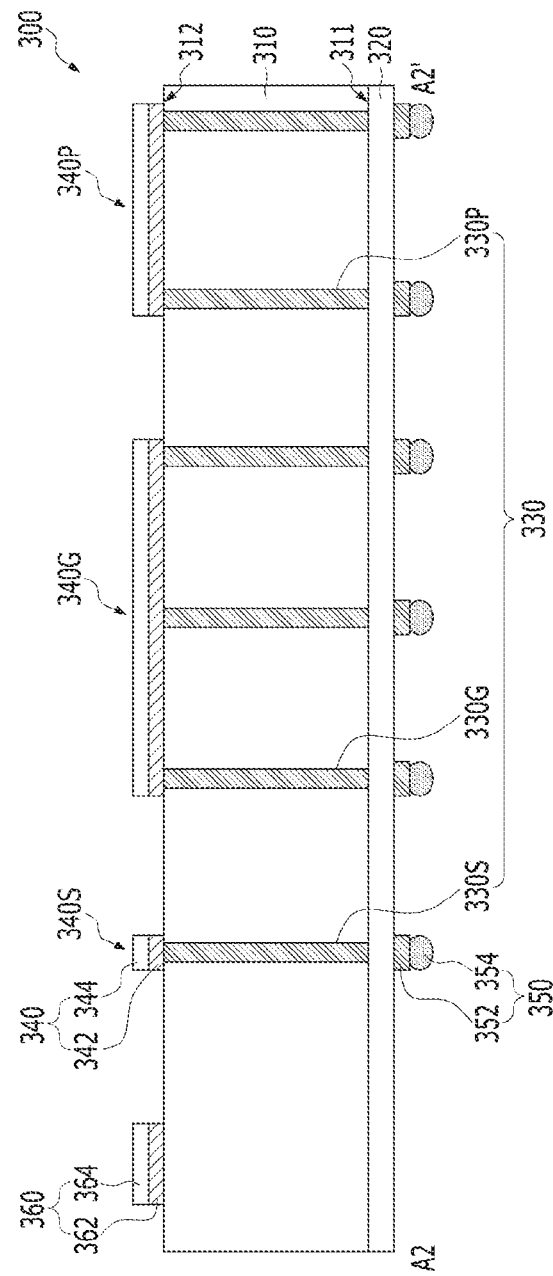

FIGS. 4 and 5 are views illustrating a semiconductor chip according to another embodiment of the present disclosure. Specifically, FIG. 4 is a planar view showing a back surface of the semiconductor chip of the present embodiment, and FIG. 5 is a cross-sectional view taken along a line A2-A2' of FIG. 4. Parts that are substantially the same as those of the embodiment of FIGS. 1 and 2 described above will be omitted from the detailed description.

Referring to FIGS. 4 and 5, a semiconductor chip 300 of the present embodiment may include a body portion 310 having a front surface 311 and a back surface 312, a wiring portion 320 formed over the front surface 311 of the body portion 310, penetrating electrodes 330 penetrating the body portion 310, back connection electrodes 340 formed over the back surface 312 of the body portion 310 and connected to the penetrating electrodes 330, and front connection electrodes 350 formed over the wiring portion 320 and electrically connected to the wiring portion 320. The penetrating electrodes 330 may include a signal penetrating electrode 330S, a power penetrating electrode 330P, and a ground penetrating electrode 330G. The back connection electrodes 340 may include a signal back connection electrode 340S, a power back connection electrode 340P, and a ground back connection electrode 340G. In addition, the back connection electrode 340 may include a stacked structure of a metal body 342 and a wetting layer 344. The front connection electrode 350 may include a stacked structure of a metal body 352 and a solder layer 354.

Furthermore, the semiconductor chip 300 may further include a dummy back connection electrode 360 formed over the back surface 312 of the body portion 310. The lower surface of the dummy back connection electrode 360 might not be connected to the penetrating electrode 330. Furthermore, the upper surface of the dummy back connection electrode 360 might not be connected to other components. That is, the dummy back connection electrode 360 may be in a floating state and might not function to provide electrical connection. The dummy back connection electrode 360 may have a function of further preventing the warpage phenomenon of the semiconductor chip 300 by adding a metal material on the back surface 312 of the body portion 310.

In a planar view, the dummy back connection electrode 360 may be formed to have various shapes at a position not overlapping with the penetrating electrodes 330. In particular, in the present embodiment, the dummy back connection electrode 360 may be formed along the entire edge of the semiconductor chip 300 outside the region where the penetrating electrodes 330 are arranged. In this case, it may be possible to further prevent deepening of warpage at the edge of the semiconductor chip 300. In addition, the dummy back connection electrode 360 may have the same structure as the back connection electrode 340. For example, the dummy back connection electrode 360 may include a metal body 362 and a wetting layer 364 formed over the metal body 362. However, the present embodiment is not limited thereto, and a layered-structure, a material, or the like of the dummy back connection electrode 360 may be modified differently from the back connection electrode 340.

Figure 6:
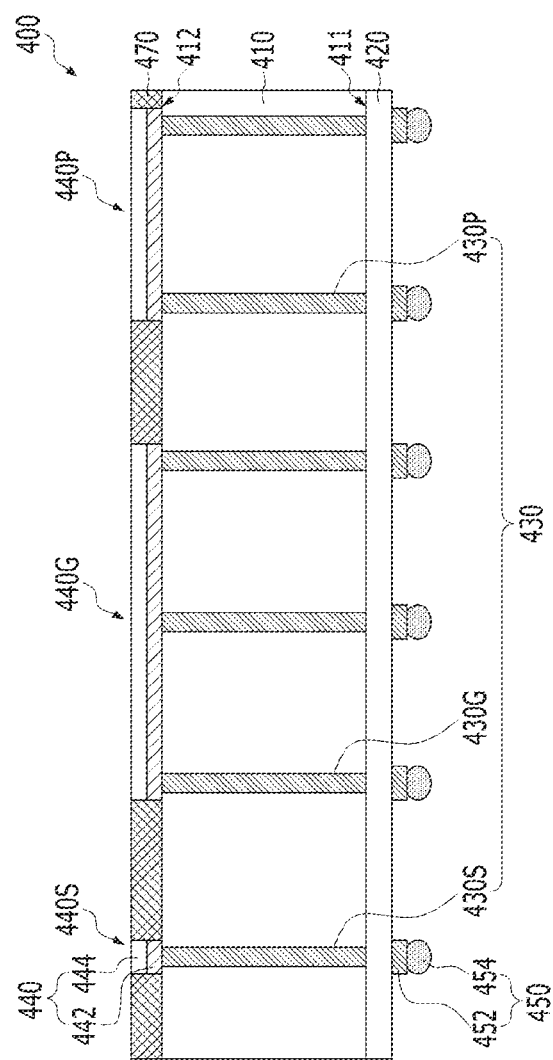
FIG. 6 is a cross-sectional view illustrating a semiconductor chip according to another embodiment of the present disclosure.

FIG. 6 is a cross-sectional view illustrating a semiconductor chip according to another embodiment of the present disclosure. Parts that are substantially the same as those of the embodiment of FIGS. 1 and 2 described above will be omitted from the detailed description.

Referring to FIG. 6, a semiconductor chip 400 of the present embodiment may include a body portion 410 having a front surface 411 and a back surface 412, a wiring portion 420 formed over the front surface 411 of the body portion 410, penetrating electrodes 430 penetrating the body portion 410, back connection electrodes 440 formed over the back surface 412 of the body portion 410 and connected to the penetrating electrodes 430, and front connection electrodes 450 formed over the wiring portion 420 and is electrically connected to the wiring portion 420. The penetrating electrodes 430 may include a signal penetrating electrode 430S, a power penetrating electrode 430P, and a ground penetrating electrode 430G. The back connection electrodes 440 may include a signal back connection electrode 440S, a power back connection electrode 440P, and a ground back connection electrode 440G. In addition, the back connection electrode 440 may include a stacked structure of a metal body 442 and a wetting layer 444. The front connection electrode 450 may include a stacked structure of a metal body 452 and a solder layer 454.

Furthermore, over the back surface 412 of the semiconductor chip 400, an insulating layer 470 filling a space between the back connection electrodes 440 (i.e., 440S, 440G, and 440P) may be further formed. That is, the back connection electrodes 440 may be embedded in the insulating layer 470.

The insulating layer 470 may be formed by depositing an insulating material covering the back surface 412 of the semiconductor chip 400 on which the back connection electrodes 440 are formed by a method such as chemical vapor deposition (CVD), and performing a planarization process, for example, chemical mechanical polishing (CMP) until the upper surface of the back connection electrode 440 is exposed. Accordingly, the insulating layer 470 may have an upper surface positioned at substantially the same level as the upper surface of the back connection electrode 440. The upper surface of the back connection electrode 440 may be exposed by the insulating layer 470, and side surfaces of the back connection electrode 440 may be surrounded by the insulating layer 470. The insulating layer 470 may include silicon oxide, silicon nitride, or a combination thereof.

A plurality of semiconductor chips 400 according to the present embodiment may be stacked. This will be described, for example, with reference to FIG. 7 below.

Figure 7:
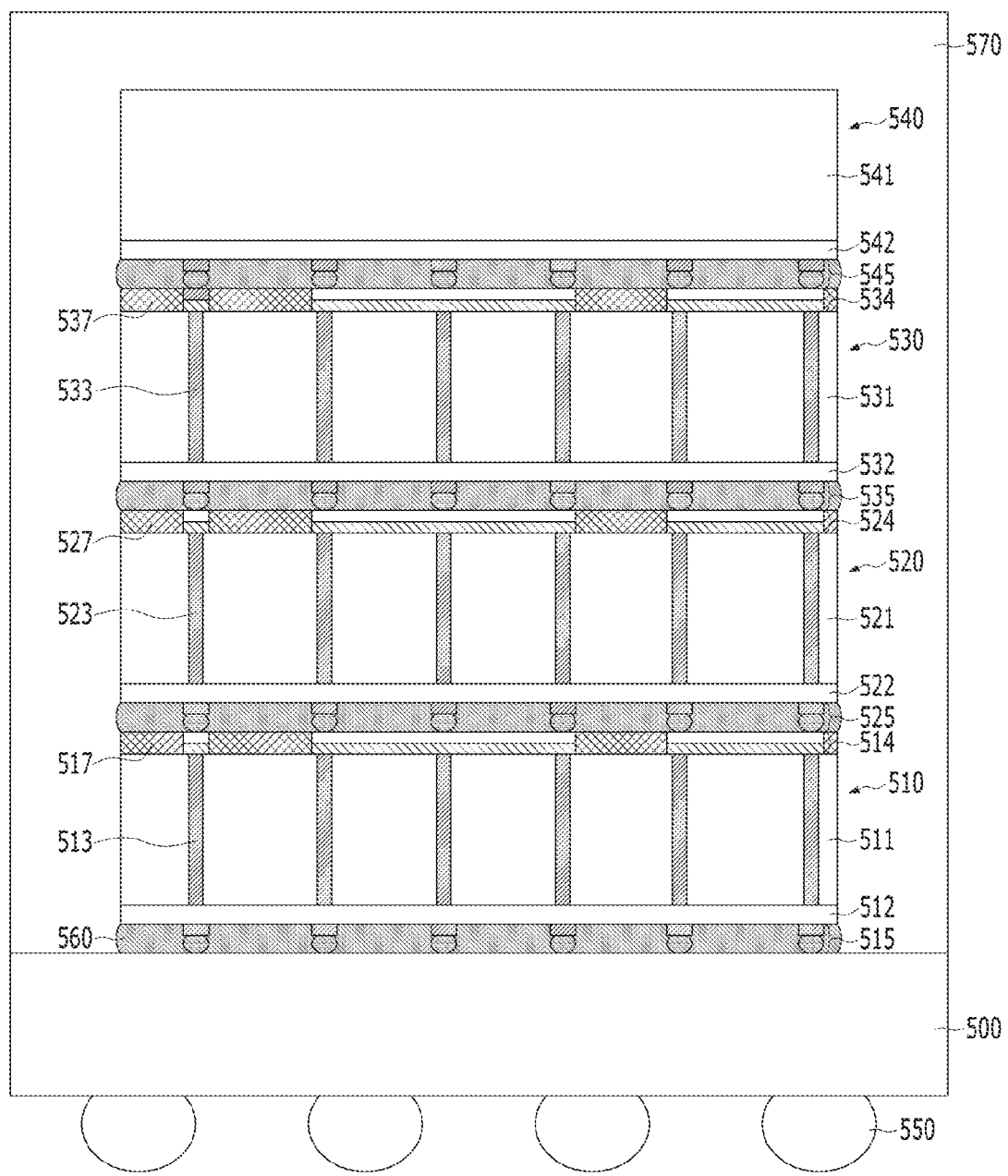
FIG. 7 is a cross-sectional view illustrating a semiconductor package according to another embodiment of the present disclosure.

FIG. 7 is a cross-sectional view illustrating a semiconductor package according to another embodiment of the present disclosure. Parts that are substantially the same as those of the embodiment of FIG. 3 described above will be omitted for detailed description.

Referring to FIG. 7, the semiconductor package of the present embodiment may include a substrate 500, and first to fourth semiconductor chips 510, 520, 530, and 540 stacked over the substrate 500 in a vertical direction.

The substrate 500 may include an upper surface on which the first to fourth semiconductor chips 510, 520, 530, and 540 are disposed, and a lower surface on which an external connection terminal 550, for connecting the semiconductor package to the outside while being located opposite to the upper surface, is disposed.

Each of the first to third semiconductor chips 510, 520, and 530, except for the fourth semiconductor chip 540 positioned at the uppermost portion of the first to fourth semiconductor chips 510, 520, 530, and 540, may be substantially the same as the semiconductor chip 400 of FIG. 6. That is, the first semiconductor chip 510 may include a body portion 511 having a front surface and a back surface, a wiring portion 512 formed over the front surface of the body portion 511, penetrating electrodes 513 penetrating the body portion 511, back connection electrodes 514 formed over the back surface of the body portion 511 and connected to the penetrating electrodes 513, an insulating layer 517 formed over the back surface of the body portion 511 and filling a space between the back connection electrodes 514, and front connection electrodes 515 formed over the wiring portion 512. The second semiconductor chip 520 may include a body portion 521 having a front surface and a back surface, a wiring portion 522 formed over the front surface of the body portion 521, penetrating electrodes 523 penetrating the body portion 521, back connection electrodes 524 formed over the back surface of the body portion 521 and connected to the penetrating electrodes 523, an insulating layer 527 formed over the back surface of the body portion 521 and filling a space between the back connection electrodes 524, and front connection electrodes 525 formed over the wiring portion 522. The third semiconductor chip 530 may include a body portion 531 having a front surface and a back surface, a wiring portion 532 formed over the front surface of the body portion 531, penetrating electrodes 533 penetrating the body portion 531, back connection electrodes 534 formed over the back surface of the body portion 531 and connected to the penetrating electrodes 533, an insulating layer 537 formed over the back surface of the body portion 531 and filling a space between the back connection electrodes 534, and front connection electrodes 535 formed over the wiring portion 532. Because the fourth semiconductor chip 540 is positioned at the uppermost portion, it may not include a penetrating electrode and a back connection electrode. That is, as shown, the fourth semiconductor chip 540 may include a body portion 541 having a front surface and a back surface, a wiring portion 542 formed over the front surface of the body portion 541, and front connection electrodes 545 formed over the wiring portion 542.

Spaces between the first semiconductor chip 510 and the substrate 500, between the first semiconductor chip 510 and the second semiconductor chip 520, between the second semiconductor chip 520 and the third semiconductor chip 530, and between the third semiconductor chip 530 and the fourth semiconductor chip 540 may be filled with a filling material 560. In this case, because portions of these spaces are in a state in which the insulating layers 517, 527, and 537 are formed, the filling material 560 may fill the remaining portions of these spaces, except the insulating layers 517, 527, and 537. Therefore, the process of forming the filling material 560 may be facilitated.

The first to fourth semiconductor chips 510, 520, 530, and 540 may be surrounded by a molding layer 570 formed over the upper surface of the substrate 500.

According to the above embodiments of the present disclosure, it may be possible to provide a semiconductor chip including penetrating electrodes, and a semiconductor package including the semiconductor chip, capable of reducing defects and improving operation characteristics thereof.

Figure 8:
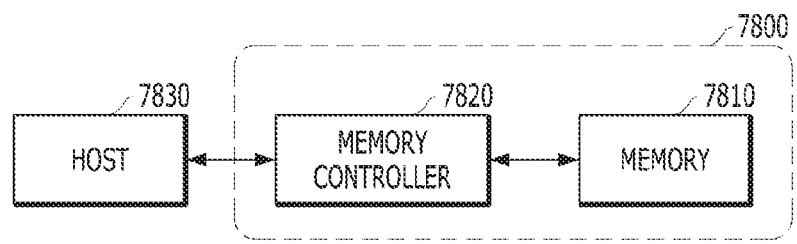
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
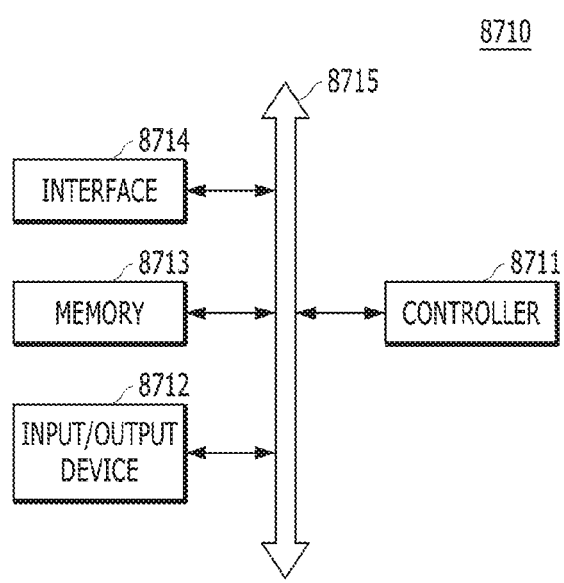
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor chip, comprising:
a body portion including a front surface and a back surface;
penetrating electrodes penetrating the body portion; and
back connection electrodes disposed over the back surface of the body portion and connected to the penetrating electrodes,
wherein:
the penetrating electrodes include a power penetrating electrode for transmitting a power voltage and a ground penetrating electrode for transmitting a ground voltage,
the back connection electrodes include a power back connection electrode connected to the power penetrating electrode and a ground back connection electrode connected to the ground penetrating electrode, and
one power back connection electrode is connected with two or more power penetrating electrodes at the same time, and one ground back connection electrode is connected with two or more ground penetrating electrodes at the same time,
wherein:
the power penetrating electrode includes a plurality of power penetrating electrodes which are arranged in a line along a first direction to form a column of power penetrating electrodes,
the power back connection electrode includes a line portion extending in the first direction to overlap with the column of power penetrating electrodes, the ground penetrating electrode includes a plurality of ground penetrating electrodes which are arranged in a line along the first direction to form a column of ground penetrating electrodes, and the ground back connection electrode includes a line portion extending in the first direction to overlap with the column of ground penetrating electrodes, wherein the power back connection electrode and the ground back connection electrode face each other in a second direction crossing the first direction, wherein the power penetrating electrode further includes a side power penetrating electrode disposed at one or more sides of the column of power penetrating electrodes in the second direction, the power back connection electrode further includes a protrusion portion protruding from its line portion in the second direction to overlap with the side power penetrating electrode, the ground penetrating electrode further includes a side ground penetrating electrode disposed at one or more sides of the column of ground penetrating electrodes in the second direction, and the ground back connection electrode further includes a protrusion portion protruding from its line portion in the second direction to overlap with the side ground penetrating electrode.

2. The semiconductor chip according to claim 1, wherein the protrusion portion of the power back connection electrode and the protrusion portion of the ground back connection electrode face each other in the first direction.

3. The semiconductor chip according to claim 2, wherein the protrusion portion of the power back connection electrode includes a plurality of protrusion portions of the power back connection electrode, and the protrusion portion of the ground back connection electrode includes a plurality of protrusion portions of the ground back connection electrode, and the plurality of protrusion portions of the power back connection electrode and the plurality of protrusion portions of the ground back connection electrode are alternately arranged along the first direction.

4. The semiconductor chip according to claim 1, wherein the back connection electrode includes a plurality of back connection electrodes, and wherein the semiconductor chip further comprises:
an insulating layer formed over the back surface of the body portion and filling a space between the plurality of back connection electrodes.

5. The semiconductor chip according to claim 1, further comprising:
front connection electrodes disposed over the front surface of the body portion and connected to the penetrating electrodes.

6. A semiconductor chip, comprising:
a body portion including a front surface and a back surface;
penetrating electrodes penetrating the body portion;
back connection electrodes disposed over the back surface of the body portion and connected to the penetrating electrodes; and
a dummy back connection electrode formed over the back surface of the body portion,
wherein:
the penetrating electrodes include a power penetrating electrode for transmitting a power voltage and a ground penetrating electrode for transmitting a ground voltage, the back connection electrodes include a power back connection electrode connected to the power penetrating electrode and a ground back connection electrode connected to the ground penetrating electrode, one power back connection electrode is connected with two or more power penetrating electrodes at the same time, and one ground back connection electrode is connected with two or more ground penetrating electrodes at the same time, the dummy back connection electrode is disposed not to be connected to the penetrating electrodes, and the dummy back connection electrode is formed along all sides of the body portion in a rectangle shape to surround a region where the penetrating electrodes are arranged.

7. The semiconductor chip according to claim 6, wherein the dummy back connection electrode has substantially the same layered-structure as the back connection electrode.

8. A semiconductor package, comprising:
a first semiconductor chip; and
a second semiconductor chip stacked in a vertical direction with the first semiconductor chip,
wherein each of the first and second semiconductor chips comprises:
a body portion including a front surface and a back surface;
penetrating electrodes penetrating the body portion; and
back connection electrodes disposed over the back surface of the body portion and connected to the penetrating electrodes, wherein the penetrating electrodes include a power penetrating electrode for transmitting a power voltage and a ground penetrating electrode for transmitting a ground voltage, the back connection electrodes include a power back connection electrode connected to the power penetrating electrode and a ground back connection electrode connected to the ground penetrating electrode, and one power back connection electrode is connected with two or more power penetrating electrodes at the same time, and one ground back connection electrode is connected with two or more ground penetrating electrodes at the same time.

9. The semiconductor package according to claim 8, wherein each of the first and second semiconductor chips further comprises:
front connection electrodes disposed over the front surface of the body portion and connected to the penetrating electrodes, and wherein the back connection electrodes of the first semiconductor chip and the front connection electrodes of the second semiconductor chip are connected to each other.

10. The semiconductor package according to claim 9, further comprising:
a filling material filling a space between the first semiconductor chip and the second semiconductor chip.

11. The semiconductor package according to claim 10, wherein the first semiconductor chip further comprises an insulating layer formed over the back surface of the body portion of the first semiconductor chip and filling a space between the back connection electrodes of the first semiconductor chip, and the filling material fills a remaining space between the first semiconductor chip and the second semiconductor chip, excluding the insulating layer.

12. The semiconductor chip according to claim 8, wherein
the penetrating electrodes include a signal penetrating electrode for transmitting a signal, and
the back connection electrodes include a signal back connection electrode connected to the signal penetrating electrode.

13. The semiconductor chip according to claim 12, wherein one signal back connection electrode is connected with one signal penetrating electrode.

14. The semiconductor chip according to claim 12, wherein
the body portion includes a central region and edge regions disposed at both sides of the central region,
the signal penetrating electrode and the signal back connection electrode are disposed in the central region,
the power penetrating electrode and the power back connection electrode are disposed in the edge regions, and
the ground penetrating electrode and the ground back connection electrode are disposed in the edge regions so as not to overlap with the power penetrating electrode and the power back connection electrode.

15. The semiconductor chip according to claim 8, wherein
the power penetrating electrode includes a plurality of power penetrating electrodes which are arranged in a line along a first direction to form a column of power penetrating electrodes,
the power back connection electrode includes a line portion extending in the first direction to overlap with the column of power penetrating electrodes,
the ground penetrating electrode includes a plurality of ground penetrating electrodes which are arranged in a line along the first direction to form a column of ground penetrating electrodes, and
the ground back connection electrode includes a line portion extending in the first direction to overlap with the column of ground penetrating electrodes.

16. The semiconductor chip according to claim 15, wherein the power back connection electrode and the ground back connection electrode face each other in a second direction crossing the first direction.

17. The semiconductor chip according to claim 16, wherein
the power back connection electrode includes a plurality of power back connection electrodes, and
the ground back connection electrode includes a plurality of ground back connection electrodes, and
the plurality of power back connection electrodes and the plurality of ground back connection electrodes are alternately arranged along the second direction.

* * * * *